United States Patent [19]
Grimm

[11] Patent Number: 4,873,764
[45] Date of Patent: Oct. 17, 1989

[54] COMPONENT MOUNTING PROCESS FOR PRINTED CIRCUIT BOARDS

[75] Inventor: Frank W. Grimm, Alsip, Ill.

[73] Assignee: Zenith Electronics Corporation, Glenview, Ill.

[21] Appl. No.: 260,852

[22] Filed: Oct. 21, 1988

Related U.S. Application Data

[62] Division of Ser. No. 137,496, Dec. 23, 1987.

[51] Int. Cl.⁴ .............................................. H05K 3/36
[52] U.S. Cl. ...................................... 29/830; 29/739; 29/832; 361/414
[58] Field of Search .................. 361/414; 29/845, 832, 29/739; 174/68.5

[56] References Cited

U.S. PATENT DOCUMENTS

| | | | |
|---|---|---|---|
| 4,449,769 | 5/1984 | Kobeyashi et al. | 29/832 X |
| 4,649,461 | 3/1987 | Matsuta | 361/414 X |
| 4,725,920 | 2/1988 | Ijichi et al. | 361/414 X |

FOREIGN PATENT DOCUMENTS 3115303  11/1982  Fed. Rep. of Germany ........ 29/739

OTHER PUBLICATIONS

"Japan Unveils Below-the-Surface-Mount Technology." *Electronic Packaging and Production Magazine*, May, 1987.

Primary Examiner—Howard N. Goldberg
Assistant Examiner—Carl J. Arbes

[57] ABSTRACT

A process is disclosed for use in the manufacture of layered printed circuit board assembly having first and second layers with electrically conductive patterns thereon. The assembly has at least one inner layer between the first and second layers for receiving and retaining a surface-mount device inserted through aligned holes in the layers. The device has an electrically conductive cap at each end for electrical connection to the conductive patterns. The inner layer physically retains the surface-mount device in place pending the electrical connection of the end caps to the conductive patterns, and by virtue of its being inherently compliant and yielding, provides for physically retaining the surface-mount device in place pending the electrical and mechanical connection of the electrically conductive end caps to the conductive patterns.

5 Claims, 2 Drawing Sheets

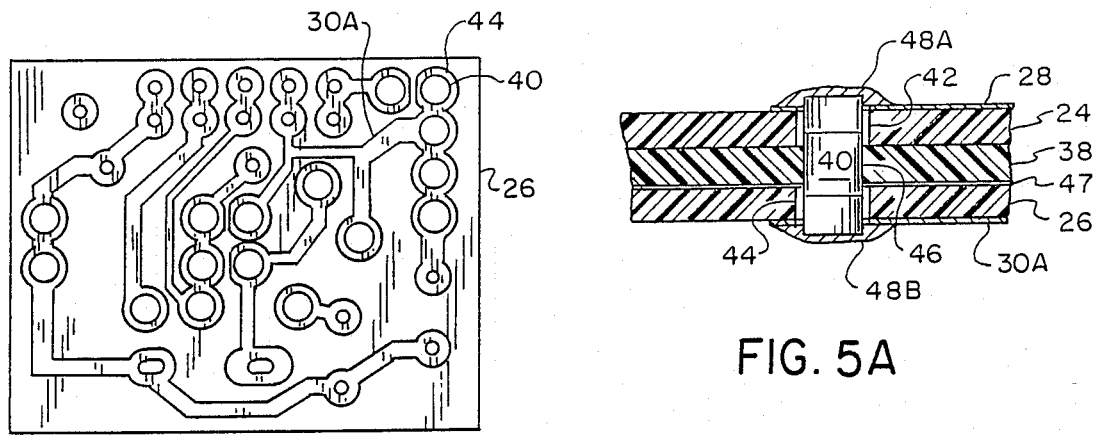
FIG. 5
FIG. 5A
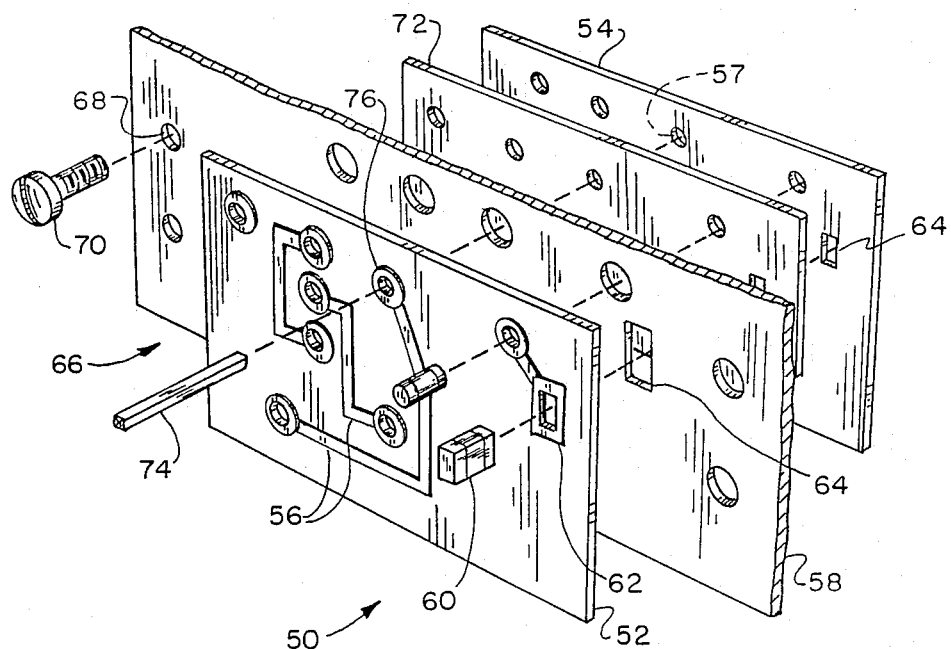
FIG. 6
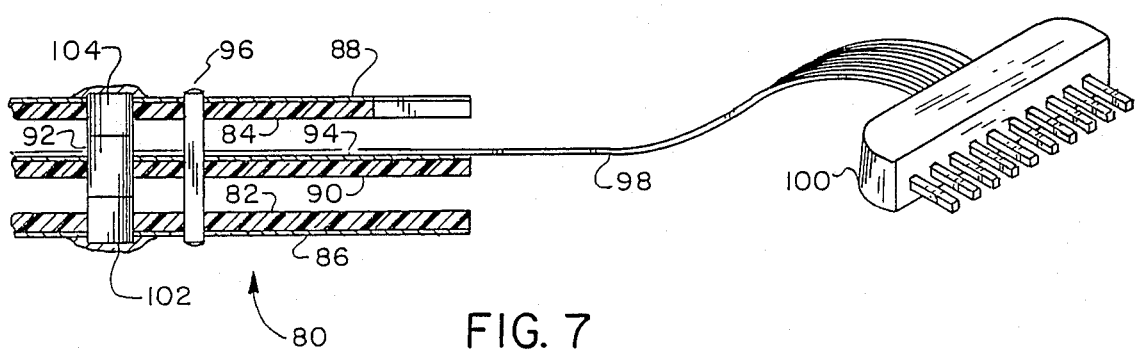
FIG. 7

COMPONENT MOUNTING PROCESS FOR PRINTED CIRCUIT BOARDS

CROSS REFERENCE TO RELATED APPLICATION

This application is a division of application Ser. No. 137,496 filed Dec. 23, 1987.

This specification includes an account of the background of the invention and the prior art, a description of the best mode presently contemplated for carrying out the invention, and appended claims.

BACKGROUND OF THE INVENTION

Field of the Invention

This invention relates generally to printed circuit boards, and more particularly to an improved process for mounting active electronic components in relation to such boards.

Conventional electronic components such as resistors and capacitors having wire leads are normally mounted on the surface of printed circuit boards, with the leads threaded through holes in the boards. Other surface-mounted devices ("SMDs") are leadless, and may be either tubular or rectangular in cross-section, and have metallic caps on the ends in lieu of wire leads. Those of rectangular form are commonly referred to as "chips." SMD and chip components may comprise resistors, capacitors, diodes and inductors. Typical power handling capability is about ⅛ of a watt for resistors, and a range of 1.0 picofarads to 0.2 microfarad in capacitors.

FIG. 1 depicts a layered printed circuit board assembly showing metal prior art means for installing SMD components on the outer surfaces of printed circuit boards. FIG. 1A depicts a typical SMD component 4, shown as having electrically conductive end caps 6 and 8 for electrical connection to the component in lieu of wire leads. The standard length of a component of this type is 0.130 inch; the length of a "chip" component is slightly less; that is, about 0.126 inch.

Electronic components can also be packaged in a "cordwood" configuration; that is, oriented in parallel either vertically or horizontally, and as close together as thermal and other characteristics will allow. Another well-known form of packaging is by the use of a "honeycomb" of pre-molded or pre-drilled spacers having apertures or openings for receiving and spacing components such as resistors and capacitors.

An automatic component mounter for SMDs has been disclosed that provides for mounting MELF components beneath the surface of the printed circuit board. "MELF" is an acronymic term coined by a Japanese manufacturer for "metal electrode face," and signifies SMD components which have conductive caps on each end in lieu of wire leads. As indicated by FIG. 2, MELF components 10 are inserted into over-size holes 12A, 12B and 12C formed in the base material 14 of a double-sided printed circuit board 16. The components are secured in the holes 12A, 12B and 12C by the application of an epoxy resin 18 which fills the space between the walls of the holes and the sides of the MELF components 10. The caps are then attached by solder 20 to the printed wiring. It will be noted that the holes 12 are preformed in the base material before final assembly by either drilling or molding. The structure and essentially comprises the "honeycomb" described in the foregoing in that the MELF components are inserted into and secured in the preformed compartments. ("Japan unveils below-the-surface-mount technology." Electronic Packaging and Production magazine, May 1987.)

OBJECTS OF THE INVENTION

It is a primary object of this invention to provide for greater packing density of conventional components in printed circuit boards.

It is an object of this invention to provide for the isolation of circuits and components in printed circuit boards that might otherwise interact.

It is another object of this invention to lower the cost of manufacture of printed circuit boards.

It is a further object of this invention to provide a process for installing surface mount devices through printed circuit boards without the use of an adhesive.

It is an object of this invention o provide a process capable of increasing throughput in the manufacture of printed circuit boards.

It is an object of this invention to provide a process for electrically shielding and heat-sinking surface mount devices in printed circuit boards.

It is an object of this invention to provide for electrical connection of a printed circuit board to other assemblies. It is an object of the invention to provide for mechanical attachment of a printed circuit board to an adjacent component.

It is yet another object of the invention to provide a process for improving the quality and reliability of printed circuit boards.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

FIG. 5 is a plan view of the outer surface of the bottom layer of a board depicted in FIG. 3 showing the means for electrically connecting the surface-mount devices as installed according to the invention;

FIG. 5A is an enlarged depiction of the cutaway view of the board depicted in FIG. 3, showing details of the means for electrically connecting a surface-mount device according to the invention;

FIG. 6 is an exploded view in perspective of a layered printed circuit board assembly installed according to the invention having inner-layer means for shielding and heat-sinking the assembly; and FIG. 7 is an exploded perspective view of a layered printed circuit board assembly according to the invention in which means are indicated for electrical connection to other assemblies.

DESCRIPTION OF THE PREFERRED EMBODIMENT

Figure 1:
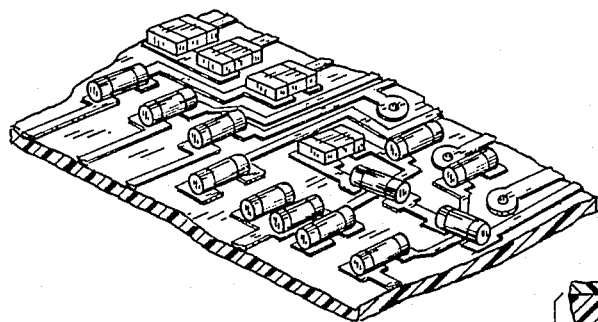
FIG. 1 is a perspective view of a layered printed circuit board assembly showing prior means of installing surface-mount components on the surface of the assembly.
Figure 1A:
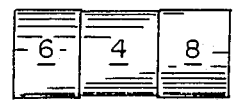
FIG. 1A is a greatly enlarged view in elevation of a typical surface mount device showing details of its construction.
Figure 2:
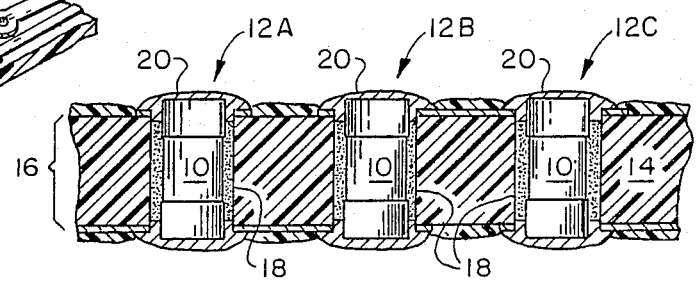
FIG. 2 is a sectional view in elevation of a prior art means for retaining surface-mount devices in the holes of a honey-comb-type structure by means of an epoxy adhesive.
Figure 3:
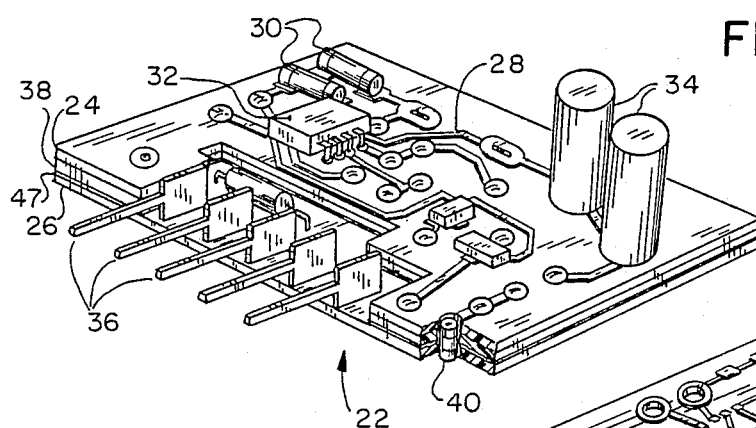
FIG. 3 is a view in perspective of a layered printed circuit board assembly having surface-mount devices installed according to the invention; a cutaway view depicts the installation of one such device.
Figure 4:
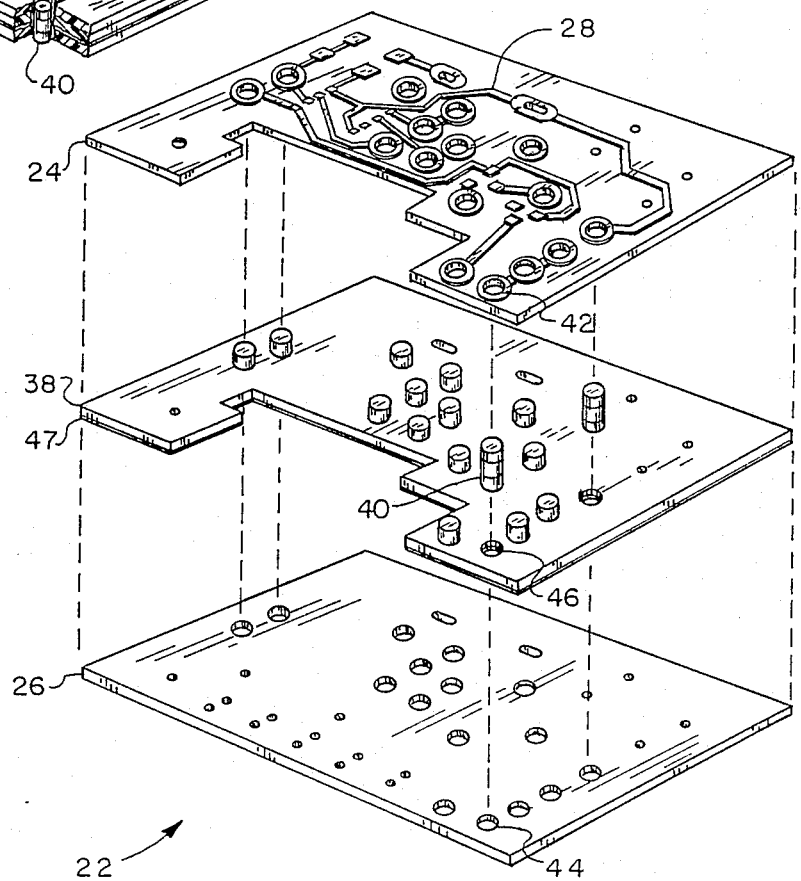
FIG. 4 is an exploded view in perspective of the assembly depicted in FIG. 3, indicating the location and orientation of surface-mount devices normally mounted on the surface, but installed according to the invention.

With reference to FIGS. 3 and 4, there is depicted a layered printed circuit board assembly 22 manufactured by the inventive process. Assembly 22 is indicated as having first and second outer layers 24 and 26. An electrically conductive pattern 28 is indicated on the outer surface of first layer 24; a similar pattern (not shown) is present on the outer surface of second layer 26. Electrically conductive patterns may be applied to one side or both sides of the outer layers, and/or any inner layer. Assembly 22 is shown as having both surface-mount devices and conventional electronic components mounted on first outer layer 24. For example, surface-mount device resistor components 30, integrated circuit 32, and two capacitor components 34 of conventional configuration, are indicated as being mounted on first outer layer 24, and variously interconnected by means of electrically conductive pattern 28. Connectors 36 provide for interconnection with other board assemblies, such as motherboards.

The composition of first and second layers 24 and 26 may comprise the conventional composite material CEM-1 having a thickness of 0.031 inch. The electrically conductive patterns may comprise copper, one ounce of which is applied per square foot of board; the patterns have a nominal thickness of 0.0014 inch, by way of example.

The layered printed circuit board assembly 22 fabricated according to the inventive process is indicated as having an inner layer 38 between the first and second outer layers 24 and 26 for receiving and retaining a surface-mount device inserted through aligned holes in the outer layers; several such devices are shown in FIGS. 3 and 4. Surface-mount device 40 in particular is indicated in the partial cutaway of assembly 22 in FIG. 3 as having been so received and retained.

FIG. 4 indicates the location of the aligned holes: hole 42 in first layer 24, and hole 44 in second layer 26. Surface-mount device 40, noted as having an electrically conductive cap at each end for electrical connection of at least one of the caps to at least one of the conductive patterns 28 and 30, is physically retained according to the invention by inner layer 38 pending the electrical connection of one or both of the end caps of component 40 to one or both of the conductive patterns. By way of example, the thickness of inner layer 38 may be about 0.032 inch, and be composed of a multiple thickness insulating material of about 0.032 inch in thickness. The material may comprise Nomex ® manufactured by the DuPont Company of Wilmington, Delaware. Other soft insulating material provided by another manufacturer may as well be used, such as for example, a metalized tape. Nomex ® may be combined with such a tape.

Inner layer 38 is adapted for receiving and retaining surface-mount device 40 by the presence of a hole 46 in inner layer 38 aligned with the aligned holes 42 and 44 in first and second layers 24 and 26. In this embodiment, hole 46 in inner layer 38 is indicated as having a diameter slightly less than the diameter of surface-mount device 40 for receiving device 40 by interference fitting. By way of example, the diameter of a surface-mount device 40 is typically 0.059 inch, and the diameter of hole 46 preferably about 0.046 inch.

Inner layer may comprise according to the invention set forth in the referent parent application, a composition that is inherently compliant and yielding at he point of receiving a surface-mount device without the need for perforating the inner layer. For example, and also according to the invention, the hole in the inner layer 38, such as hole 46, may be made oversize, and the material noted as being compliant and yielding may comprise a compliant plastic tape. A suitable tape is plasticized vinyl about 0.007 inch thick, such as Part No. 666 supplied by J. J. Glenn of West Chicago, Ill. The compliant plastic tape may have a coating of easily perforable metal providing for electrical shielding between first and second layers 24 and 26. A suitable tape of this type is metalized unplasticized polyvinyl chloride preferably about 0.003 inch thick. The thickness of the metal is so small that it in no way impedes the passage of the surface-mount device. Tapes supplied by other manufacturers may as well be used provide their compositions and properties are equivalent to those described.

With reference to FIGS. 5 and 5A, there is shown a preferred means for electrical connection of the conductive patterns to the end caps of the surface-mount devices. FIG. 5 depicts the outer surface of second layer 26 (not previously shown) with an electrically conductive pattern 30A for interconnection with surface-mounted device 40 inserted through aligned holes 42 and 44, and hole 46. The means for retaining surface-mount device 40 is indicated schematically as being by interference fitting, as has been described previously. As indicated by FIG. 5A, deposits of solder 48A and 48B provide for the electrical and mechanical connection of the end caps to the conductive patterns 28 and 30A. Solder may be applied by the reflow process, or by wave soldering.

With reference now to FIG. 6, there is shown a layered printed circuit board assembly 50 having first and second outer layers 52 and 54 with an electrically conductive pattern 56 indicated on first layer 52; a similar electrically conductive pattern 57 is also present on the outer surface of second outer layer 54, but it is not visible in the figure. A first inner layer 58 comprises according to the invention a sheet of metal interleaved between the first and second layers, and having at least one hole formed in the metal for receiving and retaining a surface-mount device 60, shown in this example as being in the form of a rectangular "chip," inserted through rectangular hole 62 in first outer layer 52 and in alignment with aligned hole 64 in second outer layer 54. Surface-mount device 60 is depicted as having an electrically conductive cap at each end for electrical connection to either or both of the conductive patterns. The sheet of metal comprising first inner layer 58 is adapted for physically retaining surface-mount device 60 in place pending the electrical connection of the end caps of the device to the conductive patterns. Accordingly, hole 64 in the first inner layer is a clearance hole and does not in itself provide for receiving and holding surface-mount device 60. Holding of device 60 is accomplished according to the invention by means of a second inner layer 72 comprising a contiguous member inherently compliant and yielding at the point of receiving surface-mount device 60. Second inner layer 72 according to the invention may comprise a compliant plastic tape attached to first, inner layer 58 by an adhesive applied to one or both of the interfaces of the first and second inner layers 58 and 72.

First inner layer 58, noted as comprising a sheet of metal, provides for heat-sinking and electrically shielding assembly 50. The sheet of metal comprising first inner layer 58 may consist of aluminum, brass, or tin-plated steel, by way of example, with a thickness, typically, of about 0.025 inch. The thickness can be greater or lesser, depending upon heat-sinking requirements. The sheet of metal comprising first inner layer 58 may also be used for the mechanical attachment of assembly 50 to another component by means of extension 66 of first inner layer 58 indicated as having a hole 68 for receiving a machine screw 70.

Assembly 50 is also indicated as having a pin 74 which is electrically conductive for the electrical interconnection of conductive pattern 76 with a complementary conductive pattern 78 (not visible in the figure) on the outer surface of second outer layer 54. Pin 74 may, if desired, make electrical contact with a conductive pattern present (but not indicated) on second inner layer 72, and in electrical contact with first inner layer 58, noted as comprising a metal sheet.

With reference now to FIG. 7, there is indicated diagrammatically an embodiment resulting from the inventive process in which a layered printed circuit board assembly 80 has first and second layers 82 and 84 with conductive patterns 86 and 88 thereon. Assembly 80 is indicated as having an inner layer 90 for receiving and retaining according to the invention a surface-mount device 92, as has been described. Inner layer 90 is depicted as having an electrically conductive pattern 94 interconnected with at least one of the conductive patterns 86 or 88 by means of a pin 96. A flexible electrical extension 98 is depicted as being extended, according to the invention, from assembly 80, and indicated as having an electrical connector 100 on the end thereof. Extension 98 may comprise a printed wiring cable, with electrical connection of its printed conductors to various of the electrically conductive layers of assembly 80. Surface-mount device 92 is noted as having electrically conductive caps 102 and 104 for electrical connection to at least one of the conductive patterns 86 and 88. Inner layer 90 provides for physically retaining surface-mount device 92 in place pending the electrical connection of the caps 102 and 104 of surface-mount device 92 to at least one of the conductive layers. Pin 96 provides for electrical interconnection with selected ones of the conductive patterns.

A process according to the invention for use in manufacture of a layered printed circuit board assembly having first and second layers with electrically conductive patterns thereon is described in the following. The process provides for through-mounting in the assembly a surface-mount device having an electrically conductive cap at each end, and comprises
  providing aligned holes in the first and second layers adjoining the conductive patterns;
  providing an inner layer between the first and second layers and forming the inner layer from a material that is inherently compliant and yielding for receiving said surface-mount device;
  inserting a surface-mount device through the aligned holes and the material;
  electrically and mechanically connecting at least one of the end caps to at least one of the conductive layers.

The inner layer, by virtue of its being inherently compliant and yielding, physically retains the surface-mount device in place pending the electrical and mechanical connection of the electrically conductive end caps to the conductive patterns.

The process may also comprise forming the inner layer of a compliant plastic tape, and providing electrical shielding between the layers by coating the tape with an easily perforable metal layer. The inventive process provides for the electrical connection of the assembly with other assemblies. A hole is formed in the inner layer aligned with the aligned holes in the first and second layers, and the inner layer is coated with metal in electrical contact with at least one of the conductive patterns. A flexible electrical extension of the inner layer is extended from the assembly and an electrical connector is attached to the extension. A surface-mount device is inserted through the aligned holes. The inner layer physically retains the surface-mount device in place pending the electrical and mechanical connection of the end caps to the conductive patterns, and by its extension, provides for electrical connection to other assemblies. The flexible extension may be formed from printed wiring cable having printed conductors electrically connected to the electrically conductive patterns of the assembly.

Further according to the inventive process, the inner layer may be formed from a sheet of metal interleaved between the first and second layers of the assembly for heat-sinking and electrically shielding the assembly. At least one hole is formed in the sheet of metal for receiving a surface-mount device inserted through the aligned holes in the outer layers. The sheet of metal is adapted to physically retain the surface-mount device in place pending the electrical connection of an end cap to at least one of the conductive patterns; the adaptation may be accomplished by applying a compliant plastic tape to the sheet of metal. The sheet of metal may also, according to the inventive process, be extended external to the assembly for mechanical attachment of the assembly to another component.

The benefits of the process according to the invention are many. For example, the use of an adhesive is not required as a support for the SMD components. A very high packaging density can be achieved at a lower piece part cost, and with a consonant overall improvement in quality. Circuits that might otherwise interact can be isolated, and components can be readily heat-sinked. And there is a further cost-benefit in that manufacturing throughput can be markedly increased.

While a particular embodiment of the invention has been shown and described, it will be readily apparent to those skilled in the art that changes and modifications may be made in the inventive process without departing from the invention in its broader aspects, and therefor, the aim of the appended claims is to cover all such changes nd modifications as fall within the true spirit and scope of the invention.

I claim:

1. For use in the manufacture of a layered printed circuit board assembly having first and second layers with electrically conductive patterns thereon, a process for through-mounting in said assembly a surface-mount device having an electrically conductive cap at each end, comprising:

providing aligned holes in said first and second layers adjoining said conductive patterns;

providing an inner layer between said first and second layers and forming said layer of plastic tape inherently compliant and yielding for receiving said surface-mount device;

coating said tape with an easily performable metal layer providing electrical shielding between said layers;

inserting said device through said aligned holes and said material;

electrically and mechanically connecting at least one of said end caps of said surface-mount device to at least one of said conductive layers;

said inner layer, by virtue of its being inherently compliant and yielding, physically retaining said surface-mount device in place pending the electrical and mechanical connection of the electrically conductive end caps to the conductive patterns 2. For use in the manufacture of a layered printed circuit board assembly having first and second layers with electrically conductive patterns thereon, a process for through-mounting in said assembly a surface-mount device having an electrically conductive cap at each end, comprising:

providing aligned holes in said first and second layers adjoining said conductive patterns;

providing an inner layer between said first and second layers comprising a compliant plastic tape coated with an easily perforable metal layer providing electrical shielding between said layers;

inserting said device through aligned holes and said compliant plastic tape;

electrically and mechanically connecting at least one of said end caps of said surface-mounted device to at least one of said conductive layers;

said compliant plastic tape physically retaining said surface-mount device in place pending the electrical and mechanical connection of said electrically conductive end caps to said conductive patterns, and said metal layer providing electrical shielding between said layers.

3. For use in the manufacture of a layered printed circuit board assembly having first and second layers with electrically conductive patterns thereon, a process for through-mounting a surface-mount device having a cap at each end, comprising:

providing aligned holes in said layers adjoining with said conductive patterns; providing an inner layer having at least one hole aligned with said aligned holes in said first and second layers, and coating said layer with metal in electrical contact with at least one of said conductive patterns.

extending a flexible electrical coextension of said inner layer from said assembly with an electrical connector on the end thereof;

inserting said surface-mount device through said aligned holes; electrically and mechanically connecting at least one of said end caps to at least one of said conductive layers;

said inner layer physically retaining said surface-mount device in plane pending the electrical and mechanical connection of said end caps to said conductive patterns, and by its extension, providing for electrical connection of said assembly to other assemblies.

4. The process according to claim 3 comprising forming said flexible extension from printed wiring cable having printed conductors, and electrically connecting said conductors to said electrically conductive patterns of said assembly.

5. For use in the manufacture of a layered printed circuit board assembly having first and second layers with electrically conductive patterns thereon, a process for through-mounting in said assembly a surface-mount device having an electrically conductive cap at each end, comprising:

providing aligned holes in said first and second layers adjoining said conductive patterns;

heat-sinking and electrically shielding said assembly by interleaving a sheet of metal between said first and second layers;

providing at least one surface-mount device having an electrically conductive cap at each end for electrical connection to at least one of said conductive patterns;

forming at least one hole in said sheet of metal for receiving said surface-mount device inserted through aligned holes in said outer layers;

adapting said sheet of metal to physically retain said surface-mount device in place pending electrical connection of said end cap to at least one of said conductive patterns by applying a compliant plastic tape to said sheet of metal; and extending said sheet of metal external said assembly, and mechanically attaching said assembly to another component.

* * * * *